(12) United States Patent
Yeh

(10) Patent No.: US 8,192,220 B2
(45) Date of Patent: Jun. 5, 2012

(54) SOCKET CONNECTOR WITH LOAD PLATE EQUIPPED WITH LOCKING DEVICE

(75) Inventor: Cheng-Chi Yeh, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 457 days.

(21) Appl. No.: 12/547,509

(22) Filed: Aug. 26, 2009

(65) Prior Publication Data

US 2010/0055957 A1    Mar. 4, 2010

(30) Foreign Application Priority Data

Aug. 26, 2008  (TW) .............................. 97215275 U

(51) Int. Cl.
*H01R 13/62* (2006.01)

(52) U.S. Cl. ...................................................... 439/331

(58) Field of Classification Search .................. 439/331, 439/266
See application file for complete search history.

(56) References Cited

FOREIGN PATENT DOCUMENTS

CN            201207455        3/2009

*Primary Examiner* — Briggitte R Hammond
(74) *Attorney, Agent, or Firm* — Ming Chieh Chang; Wei Te Chung; Andrew C. Cheng

(57) ABSTRACT

An electrical connector (100), mounted on a printed circuit board (PCB) (1), includes an insulative housing (2), a load plate (3) shielding over the insulative housing, an elastic piece (51) and a screwing element (50). The insulative housing has a plurality of electrical contacts (22) received therein. The load plate forms a tongue portion (30) at an edge thereof. The tongue portion defines at least one hole (31, 32) therein. The elastic piece forms a base portion (510) with a pair of inner hook portions (512) and a pair of outer hook portions (513) thereon. The outer hook portions and the inner hook portions go through the at least one hole and respectively and correspondingly engage with the tongue portion of the load plate and the screwing element.

15 Claims, 5 Drawing Sheets

SOCKET CONNECTOR WITH LOAD PLATE EQUIPPED WITH LOCKING DEVICE

BACKGROUND OF THE INVENTION

1. Field of the Invention

The present invention relates generally to a socket connector, and more particularly to a socket connector with a load plate equipped with a locking device in which a screw locked thereto is securely retained and prevented from loosening therefrom.

2. Description of Related Arts

CN No. 201207455 discloses an electrical connector mounted to a printed circuit board (PCB), comprising an insulative housing, a load plate shielding over the insulative housing, and a connecting device mounted to the PCB for attaching a back end of the load plate to the PCB. The load plate extends forwardly and slantways from a front end thereof to form a tongue portion. The tongue portion defines a through hole in the middle thereof and the PCB defines an aperture corresponding to the through hole. A screw element comprises a cap portion, a pole portion, and a protruding portion protruding from a conjoining section between the cap portion and the pole portion. The screw element incorporates with an elastic piece to attach the front end of the load plate to the PCB. The elastic piece forms a base portion and a pair of hook portions extending upwardly from the base portion. The base portion defines a cutout at a middle part thereof. The hook portions are respectively located at two opposite sides of the cutout to face towards each other.

In assembling, the elastic piece is attached to a lower surface of the tough portion and the screw element is attached to an upper surface of the tongue portion. The pole portion of the screw element is inserted into the through hole of the tongue portion and the cutout of the elastic piece in sequence. In the ultimate stage, for one aspect, a bottom face of the protruding portion of the screw element confronts with the upper surface of the tongue portion, and for another, the hook portion is inserted into the through hole of the tongue portion to snap with a top face of the protruding portion. The screw element and the elastic piece incorporate with each other so that they are both attached to the tongue portion of the load plate. Finally, the pole portion of the screw element further goes through the aperture to attach the front end of the load plate, i.e., the tongue portion, to the PCB. Because the screw element and the elastic piece need corporation with each other to be attached to the tongue portion, the screw element and the elastic piece must be assembled at one time. A user needs to hold the elastic piece with one hand, and the other hand holds the screw element, which is rather troublesome.

Hence, an electrical connector having a load plate equipped with a locking device in which a screw locked thereto is securely retained and prevented from loosening therefrom is desired.

SUMMARY OF THE INVENTION

Accordingly, an object of the present invention is to provide an electrical connector having a load plate equipped with a locking device in which a screw locked thereto is securely retained and prevented from loosening therefrom.

To achieve the above object, an electrical connector, mounted on a printed circuit board (PCB), includes an insulative housing, a load plate shielding over the insulative housing, an elastic piece and a screwing element. The insulative housing has a plurality of electrical contacts received therein. The load plate forms a tongue portion at an edge thereof. The tongue portion defines at least one hole therein. The elastic piece forms a base portion with a pair of inner hook portions and a pair of outer hook portions thereon. The outer hook portions and the inner hook portions go through the at least one hole and respectively and correspondingly engage with the tongue portion of the load plate and the screwing element.

Other objects, advantages and novel features of the invention will become more apparent from the following detailed description when taken in conjunction with the accompanying drawings.

DETAILED DESCRIPTION OF THE PREFERRED EMBODIMENT

Figure 1:
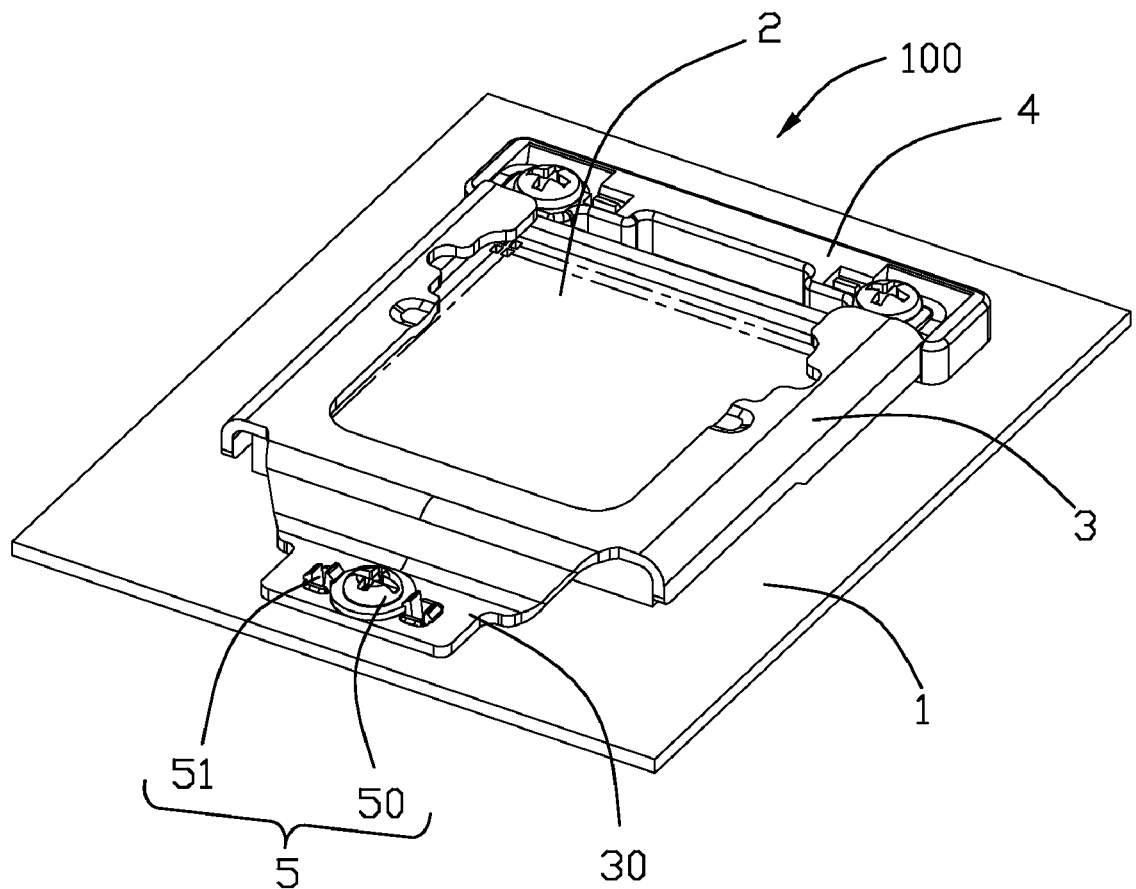
FIG. 1 is a perspective, assembled view of an electrical connector according to the present invention.
Figure 5:
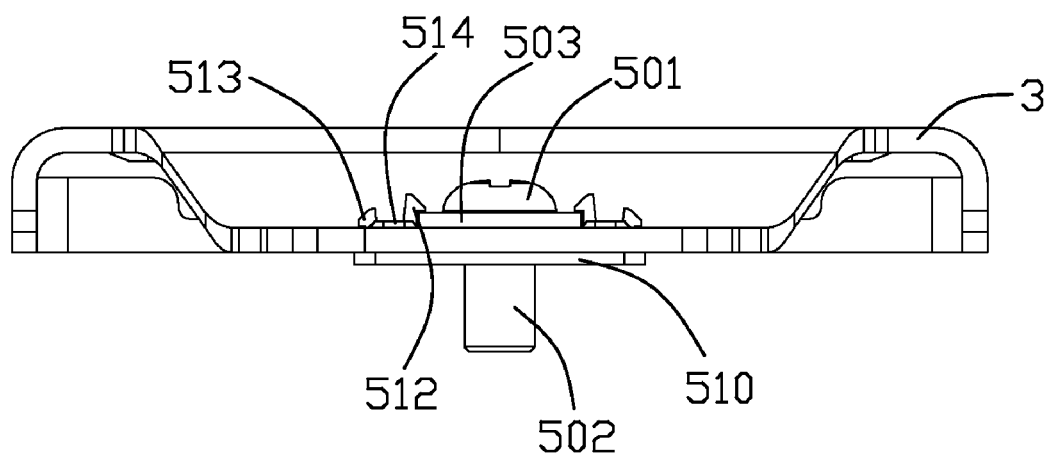
FIG. 5 is a front, elevational view of a screw element incorporating with the elastic piece to attach to the load plate.

Referring to FIGS. 1 and 5, an electrical connector 100 of the present invention, used for connecting a central processing unit (CPU, not shown) with a printed circuit board (PCB) 1, is described as following. The electrical connector 100 comprises an insulative housing 2 seated upon the PCB 1, a load plate 3 shielding over the insulative housing 2, a connecting device 4 mounted on the PCB 1 for securing a back end of the load plate 3 to the PCB 1, a locking device 5 attached to a front end of the load plate 3 for securing the front end of the load plate 3 to the PCB 1, and a backboard 6 located beneath the PCB 1.

The insulative housing 2 defines a plurality of passageways 21 for receiving a plurality of electrical contacts 22, which are usually arranged in matrix. The electrical contacts 22 have soldering portions (not labeled) for connecting with the PCB 1 and contacting portions (not labeled) for connecting with pins of the CPU so as to achieve electrical connection therebetween.

Figure 2:
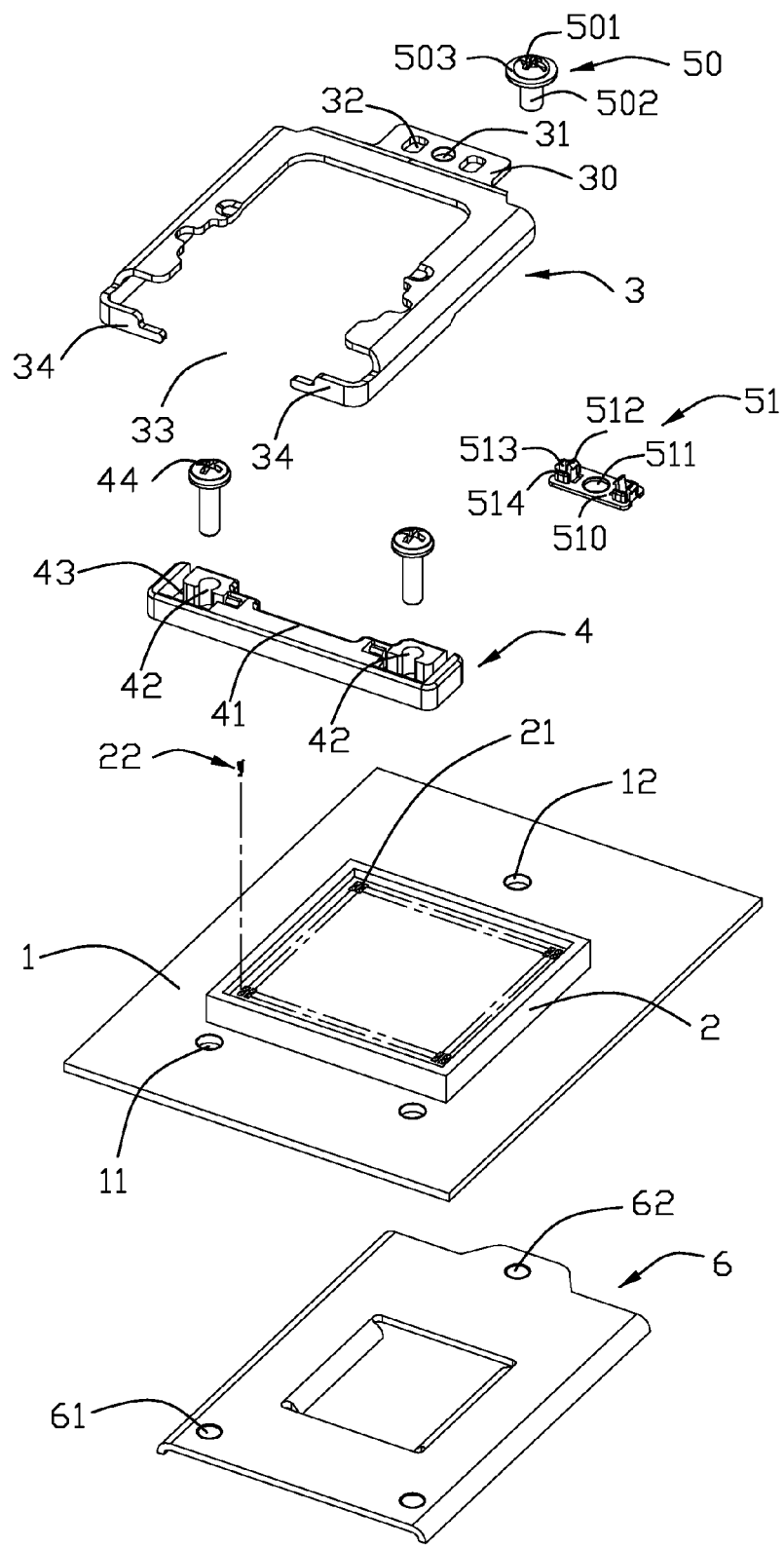
FIG. 2 is a perspective, exploded view of the electrical connector.

Referring to FIG. 2, the PCB 1 defines a pair of first apertures 11 at a back end thereof and a second aperture 12 at a front end thereof. The first apertures 11 and the second aperture 12 are respectively located two opposite sides of the insulative housing 2. In a preferred embodiment, the first apertures 11 and the second aperture 12 are disposed in a relation such that the first apertures 11 and the second aperture 12 are respectively located at vertices of an isosceles triangle. The backboard 6 located beneath the PCB 1, defines a pair of first slots 61 at a back end thereof corresponding to the first apertures 11 and a second slot 62 at a front end thereof corresponding to the second aperture 12. In correspondence with the first apertures 11 and the second aperture 12, the first slots 61 and the second slot 62 are disposed in a relation such that the first slots 61 and the second slot 62 are respectively located at vertices of an isosceles triangle, too, in a preferred embodiment.

Figure 3:
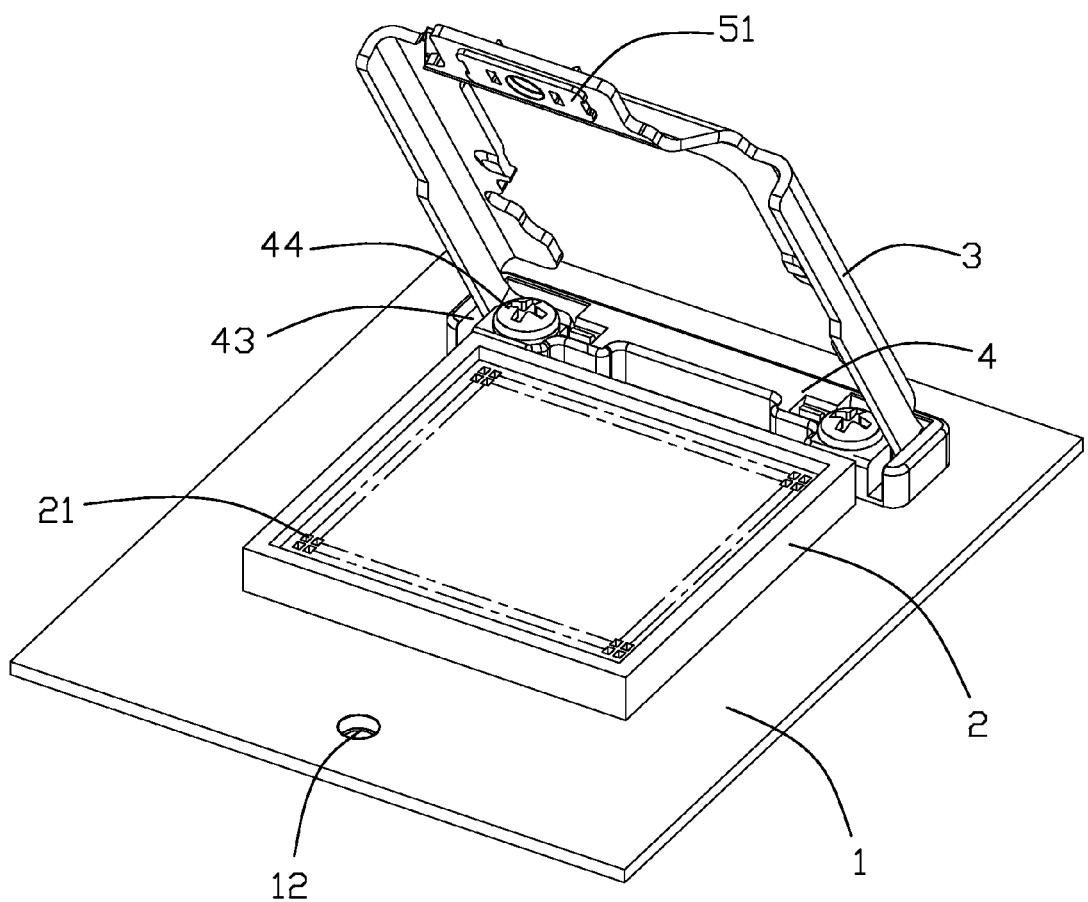
FIG. 3 is a perspective view of an elastic piece attaching to a load plate alone.
Figure 4:
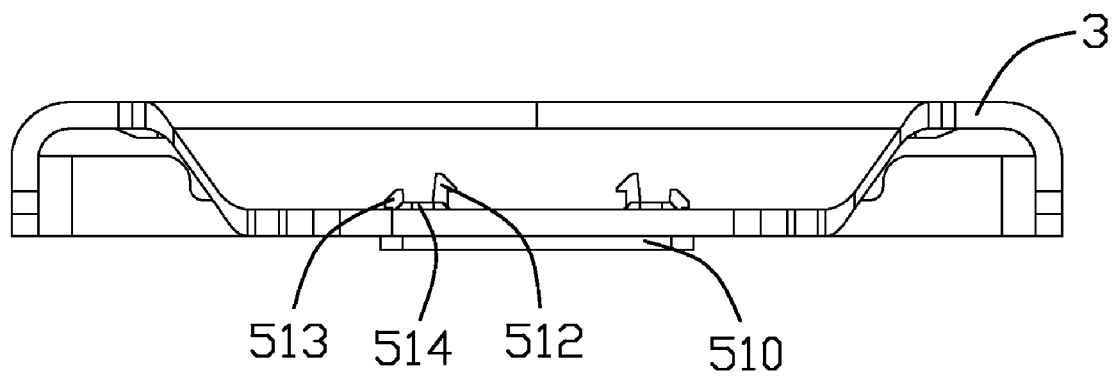
FIG. 4 is a front, elevational view of the elastic piece attaching to the load plate alone.

Referring to FIGS. 2 and 3, the connecting device 4 is a substantially U-shaped configuration and includes two combining slots 42 on two ends thereof and a recess 41 defined between the two combining slots 42. A connecting slit 43 is right-angled and is recessed from a top surface of the connecting device 4 and communicates with each combining slot 42. The connecting device 4 further includes two pin members 44, such as bolts, which are received in the corresponding combining slots 42. The pin members 44 pass through the first apertures 11 of the PCB 1 and the first slots 61 of the backboard 6 in sequence. Thus, the connecting device 4 and the backboard 6 are both secured on the back end of the PCB 1.

Referring to FIGS. 2 and 3, the load plate 3 is a hollow piece and forms a tongue portion 30 at a front part thereof. The tongue portion 30 defines a receiving hole 31 in the middle thereof and a pair of fastening holes 32 located at two opposite sides of the receiving hole 31. The load plate 3 forms a pair of pivotal portions 34 at a rear part thereof. The pivotal portions 34 extend inwardly and define an interspace 33 therebetween. The pivotal portions 34 are securely received in the connecting slits 43 of the connecting device 4 therefore, the rear end of the load plate 3 is pivotally attached to the PCB 1 by virtue of the connecting device 4.

Referring to FIGS. 1-5, the locking device 5 comprises a screwing element 50 and an elastic/gasket piece 51 activating an attachment of the screwing element 50 to the tongue portion 30. The screwing element 50 comprises a cap portion 501, a screwing pole 502 and a protruding portion 503. Both the screwing pole 502 and the protruding portion 503 are integral with the cap portion 501. The protruding portion 503 protrudes from a conjoining section between the cap portion 501 and the screwing pole 502. The elastic piece 51 is made of insulative material and comprises a base portion 510 and two pairs of hook portions, respectively called inner hook portions 512 and outer hook portions 513. Every two adjacent inner hook portion 512 and outer hook portion 513 are disposed in a back-to-back relation. The elastic piece 51 further forms a stopper portion 514 sandwiching each group of the inner hook portion 512 and the corresponding outer hook portion 513 therebetween. The inner hook portions 512 are higher than the outer hook portions 513. The elastic piece 51 defines an engaging hole 511 in the middle of the base portion 510, just located between the inner hook portions 512.

In assembling, the elastic piece 51 is attached to a lower surface of the tough portion 30, the outer hook portions 513 goes through the fastening holes 32 of the tongue portion 30 to engage with the an upper surface of the tongue portion 30 while the inner hook portions 512 also goes through the fastening holes 32 of the tongue portion 30 to achieve a higher level than the upper surface of the tongue portion 30. The screw element 50 is then attached onto the upper surface of the tongue portion 30. The screwing pole 502 of the screwing element 50 goes through the receiving hole 31 of the tongue portion 30 and the engaging hole 511 of the elastic piece 51 in sequence. In the downward movement of the screwing element, the protruding portion 503 meets the inner hook portions 512 of the elastic piece 51 and in ultimate, the inner hook portions 512 engage with an upper face of the protruding portion 503 while a lower face of the protruding portion 503 confronts with the upper surface of the tongue portion 30. Just at this moment, the locking device 5 achieves an attachment to the tongue portion 30 of the load plate 3.

In the end, the screwing pole 502 of the screwing element 50 continues to go through the second aperture 12 of the PCB 1 and the second slot 62 of the backboard 6 in sequence and therefore, the screwing element 50 is screwed securely therein. The front end of the load plate 3 i.e. the tongue portion 30 is firmly attached to the PCB 1 and the backboard 6 is secured on the front end of the PCB 1, too. Both the load plate 3 and the backboard 6 are screwed on the PCB 1 in a condition that the pair of pin members 44 and the screwing element 50 are respectively located at vertices of an isosceles triangle, therefore, firm attachments are achieved.

In the aforementioned embodiment, the tongue portion 30 defines a receiving hole 31 in the middle thereof and a pair of fastening holes 32 located at two opposite sides of the receiving hole 31, and the receiving hole 31 is used for the screwing pole 502 of the screwing element 50 to go through while the fastening holes 32 are used for receiving both the inner hook portions 512 and the outer hook portions 513. In an alternative embodiment, the tongue portion 30 defines a multifunctional hole (not shown), used for receiving all of the screwing pole 502, the inner hook portions 512 and the outer hook portions 513. Such multifunction hole makes the outer hook portions 513 go therethrough to engage with the upper surface of the tongue portion 30, receives the inner hook portions 512 and also makes the screwing pole 502 go therethrough to be engaged with the inner hook portions 512. Such multifunction hole can achieve an attachment of the locking device 5 on the load plate 3, too.

The present invention provides an elastic piece 51 for activating an attachment of the screwing element 50 to the tongue portion 30, because the elastic piece 51 is made of insulative material, it prevents shorting risk when the screwing element 50 is screwed onto the PCB 1. The elastic piece 51 forms a pair of outer hook portions 513, which can be attached to the tongue portion 30 alone. A user deals with the elastic piece 51 first and screws the screwing element 501 later. The present invention prevents a troublesome assembling method in the prior art: a user need to hold the elastic piece with one hand, and the other hand holds the screw element to assemble the locking device at one time.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. An electrical connector, mounted on a printed circuit board (PCB), comprising:
   an insulative housing, having a plurality of electrical contacts received therein;
   a load plate, shielding over the insulative housing and forming a tongue portion at an edge thereof, the tongue portion defining at least one hole therein;
   an elastic piece, forming a base portion with a pair of inner hook portions and a pair of outer hook portions thereon; and
   a screwing element;
   wherein the outer hook portions and the inner hook portions go through the at least one hole and respectively and correspondingly engage with the tongue portion of the load plate and the screwing element.

2. The electrical connector as described in claim 1, wherein every two adjacent inner hook portion and outer hook portion are disposed in a back-to-back relation.

3. The electrical connector as described in claim 2, wherein the inner hook portions are higher than the outer hook portions.

4. The electrical connector as described in claim 3, wherein the tongue portion comprises a receiving hole in a middle thereof and a pair of fastening holes located at two opposite sides of the receiving hole, and wherein the outer hook portions and the inner hook portions go through the fastening holes.

5. The electrical connector as described in claim 4, wherein the base portion defines an engaging hole and the screwing element goes through the receiving hole and the engaging hole in sequence.

6. The electrical connector as described in claim 1, wherein the screwing element forms a cap portion, a screwing pole and a protruding portion protruding from a conjoining section between the cap portion and the screwing pole, and wherein the inner hook portion engages with the protruding portion of the screwing element.

7. The electrical connector as described in claim 6, wherein a lower face defined on the protruding portion confronts with an upper surface defined on the tongue portion.

8. The electrical connector as described in claim 1, further comprising a connecting device attaching an opposite edge of the load plate relative to the tongue portion to the PCB.

9. The electrical connector as described in claim 8, wherein the connecting device is a substantial U-shaped configuration.

10. The electrical connector as described in claim 9, wherein the connecting device defines two connecting slits recessed from a top surface thereof.

11. The electrical connector as described in claim 10, wherein each connecting slit communicates with each slot.

12. The electrical connector as described in claim 10, wherein the load plate forms a pair of pivotal portions at a rear part thereof, which are received in the connecting slits of the connecting device.

13. An electrical connector comprising for mounting to a printed circuit board, comprising:
   an insulative housing defining a receiving cavity in an upper face thereof;
   a plurality of contacts disposed in the housing;
   a metallic load plate movably covering the housing; and defining a tongue portion;
   a screw extending through the tongue portion;
   a gasket piece including a base portion located under the tongue portion, an inner hook portion extending upwardly from the base portion beyond the tongue portion and holding the screw in position with regard to the tongue portion, and an outer hook portion extending from the base portion and securing said gasket piece unto the tongue portion.

14. The electrical connector as claimed in claim 13, wherein said outer hook portion extends upwardly from the base portion.

15. The electrical connector as claimed in claim 13, wherein said gasket piece defines a through hole which said screw extends through.

* * * * *